US012727219B2

(12) United States Patent
Kondo et al.

(10) Patent No.: US 12,727,219 B2
(45) Date of Patent: Sep. 1, 2026

(54) SILICON CARBIDE SUBSTRATE HAVING EXCELLENT FLATNESS AND LOW BASAL PLANE DISLOCATION DENSITY

(71) Applicant: Proterial, Ltd., Tokyo (JP)

(72) Inventors: Sadahiko Kondo, Tokyo (JP); Junya Ikeda, Tokyo (JP)

(73) Assignee: PROTERIAL, LTD., Tokyo (JP)

( * ) Notice: Subject to any disclaimer, the term of this patent is extended or adjusted under 35 U.S.C. 154(b) by 492 days.

(21) Appl. No.: 18/161,175

(22) Filed: Jan. 30, 2023

(65) Prior Publication Data

US 2023/0253459 A1 Aug. 10, 2023

(30) Foreign Application Priority Data

Feb. 4, 2022 (JP) ................................ 2022-016461

(51) Int. Cl.
*H10D 62/832* (2025.01)
*C30B 25/20* (2006.01)
(Continued)

(52) U.S. Cl.
CPC ......... *H10D 62/8325* (2025.01); *C30B 25/20* (2013.01); *C30B 29/36* (2013.01); *H10D 12/031* (2025.01)

(58) Field of Classification Search
CPC .. H10D 62/8325; H10D 12/031; C30B 25/20; C30B 29/36; H01L 21/0475; H01L 21/0445; H01L 21/02378; H01L 21/02529; H01L 21/02634; H01L 21/02664; H01L 21/304
See application file for complete search history.

(56) References Cited

U.S. PATENT DOCUMENTS 9,076,750 B2 7/2015 Sato
2003/0041798 A1 3/2003 Wenski et al.
(Continued)

FOREIGN PATENT DOCUMENTS

JP 2008311542 A 12/2008
JP 2012231005 A 11/2012
(Continued)

OTHER PUBLICATIONS

Notification of Reasons for Rejection for Japanese Patent Application No. 2022-016461, dated Mar. 26, 2024 and its English translation.

(Continued)

*Primary Examiner* — Norman D Richards
*Assistant Examiner* — Ethan Edward Cutler
(74) *Attorney, Agent, or Firm* — McCormick, Paulding & Huber PLLC

(57) ABSTRACT

A new substrate manufacturing method of obtaining a SiC epitaxial substrate having excellent flatness and a SiC epitaxial substrate having excellent flatness are provided. In a Sic epitaxial substrate having an epitaxial film obtained by epitaxially growing silicon carbide on a front surface of a silicon carbide substrate, the SiC epitaxial substrate has a first main surface made of the epitaxial film and a second main surface opposite to the first main surface. A maximum value of SBIR on the second main surface based on a 10 mm square site satisfies a condition of 0.1 μm or more and 1.5 μm or less.

8 Claims, 5 Drawing Sheets

(51) Int. Cl.
*C30B 29/36* (2006.01)
*H10D 12/01* (2025.01)

(56) References Cited

U.S. PATENT DOCUMENTS

| | | | | |
|---|---|---|---|---|
| 2003/0107041 | A1* | 6/2003 | Tanimoto | H10D 62/8325 257/E29.345 |
| 2008/0113510 | A1 | 5/2008 | Kato et al. | |
| 2010/0151658 | A1* | 6/2010 | Abe | B82Y 20/00 257/E21.09 |
| 2012/0149177 | A1 | 6/2012 | Nakayoshi et al. | |
| 2014/0117380 | A1* | 5/2014 | Loboda | H01L 21/02008 438/692 |
| 2015/0060882 | A1* | 3/2015 | Tarui | H10D 64/111 257/77 |
| 2015/0170928 | A1* | 6/2015 | Nakayama | H01L 21/02019 428/141 |
| 2015/0311328 | A1 | 10/2015 | Takei et al. | |
| 2016/0032486 | A1* | 2/2016 | Hansen | C30B 33/10 117/109 |
| 2016/0133465 | A1 | 5/2016 | Sasaki | |
| 2016/0211205 | A1 | 7/2016 | Nagatomo et al. | |
| 2019/0244850 | A1 | 8/2019 | Berger et al. | |
| 2021/0272793 | A1 | 9/2021 | Park et al. | |

FOREIGN PATENT DOCUMENTS

| | | | |
|---|---|---|---|
| JP | 2016501809 | A | 5/2014 |
| JP | 2015160750 | A | 9/2015 |
| JP | 2015211141 | A | 11/2015 |
| JP | 2020-026359 | A | 2/2020 |
| JP | 2021138597 | A | 9/2021 |

OTHER PUBLICATIONS

Notification of Reasons for Rejection for Japanese Patent Application No. 2022-016461, dated Mar. 26, 2024 and its translation.
Notification of Reasons for Refusal and its English translation for corresponding Japanese Patent Application No. 2024-082679 dated Jul. 2, 2024.
Extended European Search Report corresponding to European Patent Application No. 23153486.8 dated Jul. 6, 2023.
Notification of Reasons for Rejection and its English translation thereof for corresponding Japanese Patent Application No. 2024-212105, dated Oct. 14, 2025 (3 pages total).
Communication pursuant to Article 94(3) EPC in connection with European Patent Application 23153486.8-1211, issued Jul. 10, 2026. 6 pages.

* cited by examiner

SILICON CARBIDE SUBSTRATE HAVING EXCELLENT FLATNESS AND LOW BASAL PLANE DISLOCATION DENSITY

CROSS-REFERENCE TO RELATED APPLICATION

This application claims foreign priority benefits under 35 U.S.C. § 119 from Japanese Patent Application No. 2022-016461, filed Feb. 4, 2022, the content of which is hereby incorporated by reference in its entirety.

TECHNICAL FIELD

The present invention relates to a SiC epitaxial substrate having an epitaxial film on a front surface of a silicon carbide substrate and a method of manufacturing the same.

BACKGROUND

A SiC epitaxial substrate having an epitaxial film made of silicon carbide (hereinbelow, may also be referred to as "SiC") formed on a front surface of a silicon carbide substrate is typically manufactured by a vapor deposition method. In the vapor deposition of the Sic, it is known that the SiC also adheres to, for example, a surface (back surface) opposite to the surface on which the epitaxial film is to be formed, and grows in a protruding shape.

If the SiC grows on the back surface of the substrate as described above, the substrate surface is changed or surface asperities are caused by three-dimensionally grown protrusions. In either case, the substrate shape changes from its expected shape, and thus, the flatness of the substrate is deteriorated. Therefore, manufacturing a semiconductor device using these substrates may adversely affect the characteristics of the semiconductor device.

In such a case, SiC formed by unintended epitaxial growth needs to be removed by, for example, grinding the back surface of the substrate. When such a removing operation is performed, steps in the SiC substrate manufacturing process are complicated, such as formation of a protective film to protect the front surface of the substrate, and removal of the protective film after the removing operation is performed.

In view of this, a method of manufacturing the SiC substrate is proposed, the method forming a protective film on the back surface before epitaxial growth so that protrusions are formed on the protective film, and being capable of easily removing the Sic protrusions formed on the back surface of the substrate (e.g., refer to Japanese Patent Application Laid-Open Publication 2015-160750 (Patent Document 1)).

Patent Document 1: Japanese Patent Application Laid-Open Publication No. 2015-160750

SUMMARY

Problems to be Solved by the Invention

However, in forming the epitaxial film by epitaxial growth, the flatness may be deteriorated in addition to the above problem.

For example, in the epitaxial film of the SiC substrate, more fluctuation of source gas occurs at a peripheral part of the SiC substrate than a central part thereof. Thus, the speed of epitaxial growth changes, which may cause variations in the thickness of the formed epitaxial film.

Also, if the original flatness of the SiC substrate used is varied so that, for example, the thickness of the SiC substrate slightly differs between the central part and the peripheral part to form the taper shape as a whole, the epitaxial film may take over the original flatness of the substrate, and the flatness of the SiC epitaxial substrate to be formed may not be ensured.

If sufficient flatness of the SiC epitaxial substrate is not ensured, problems arise in a photolithography process performed thereafter. In other words, when a mask pattern is formed on the front surface having the epitaxial film while the back surface of the SiC epitaxial substrate is fixed to a vacuum chuck, the deterioration of the flatness of the SiC epitaxial substrate causes shift of the position of the mask pattern from a desired position, and reduces the yield of resultant semiconductor chips.

Thus, the inventors of the present invention have endeavored to make studies for solving the above problems to provide a new substrate manufacturing method for obtaining a SiC epitaxial substrate having excellent flatness and a SiC epitaxial substrate having excellent flatness.

Means for Solving the Problems

A SiC epitaxial substrate in an embodiment is a SiC epitaxial substrate an epitaxial film obtained by epitaxially growing silicon carbide on a front surface of a silicon carbide substrate, the SiC epitaxial substrate has a first main surface made of the epitaxial film and a second main surface opposite to the first main surface, and a maximum value of SBIR of the second main surface based on a 10 mm square site satisfies a condition of 0.1 μm or more and 1.5 μm or less.

A method of manufacturing a SiC epitaxial substrate in an embodiment includes: a step (a) of preparing a silicon carbide substrate having a plate-like shape; a step (b) of epitaxially growing silicon carbide on a front surface of the silicon carbide substrate to form a first main surface made of an epitaxial film; a step (c) of forming a protective film on a surface of the epitaxial film; a step (d) of grinding or polishing an opposite surface to the first main surface of the silicon carbide substrate, based on a shape of the first main surface to form a second main surface; and a step of (e) removing the protective film.

Effects of the Invention

According to the SiC epitaxial substrate and the method of manufacturing the SiC epitaxial substrate of an embodiment, it is possible to provide a SiC epitaxial substrate having excellent flatness. Also, in this SiC epitaxial substrate having excellent flatness, vertical misalignment of a mask pattern relative to the substrate main surface in photolithography that is one of the semiconductor chip manufacturing processes can be suppressed, and the manufacturing yield of the semiconductor chips can be improved.

BRIEF DESCRIPTIONS OF THE DRAWINGS

DETAILED DESCRIPTION

A SiC epitaxial substrate and a method of manufacturing the SiC epitaxial substrate according to an embodiment of the present invention will be described below.

Note that the same components are denoted by the same reference signs in principle throughout all the drawings for describing the present embodiments, and the repetitive description thereof will be omitted. Hatching may be used even in a plan view or hatching may be omitted even in a cross-sectional view so as to make the drawings easy to see.

<Background to Study>

First, in order to explain the present embodiment, problems of the related art will be supplementally explained. For example, the Patent Document 1 explained above as the related art has the following practical problems in addition to ensuring the sufficient flatness explained above.

For example, in the method of manufacturing the SiC epitaxial substrate described in this Patent Document 1, the protective film is formed on the silicon carbide substrate before the epitaxial film is formed, and the epitaxial growth is performed thereafter. Then, substances adhered to the back surface are removed by lifting off the protective film. However, in this method, the epitaxial growth is performed in a state with the protective film, and therefore, an organic material such as a resist cannot be used for the protective film.

In addition, in this Patent Document 1, anisotropic etching or wet etching is used to lift off the protective film after the epitaxial growth. However, in this case, deposits act as barriers, and there is a risk of partial remain of the protective film.

Usage of tape peeling is conceivable to remove the protective film. However, in this case, an adhesion force of the tape is not uniform, or a force acting on the tape is not uniform when the tape is peeled off. Thus, there is still the partial remain of the protective film, and besides, there is a risk of occurrence of contamination such as tape residues.

In the present invention, in addition to the flatness described in the section “problems to be solved by the invention”, the present inventors have also studied a technique capable of more easily forming and removing the protective film to be the problem in the Patent Document 1 as described above, and capable of suppressing the occurrence of the residues and others. Hereinafter, the technical idea of the present embodiment will be described in detail to include this point.

<SiC Epitaxial Substrate>

Figure 1:
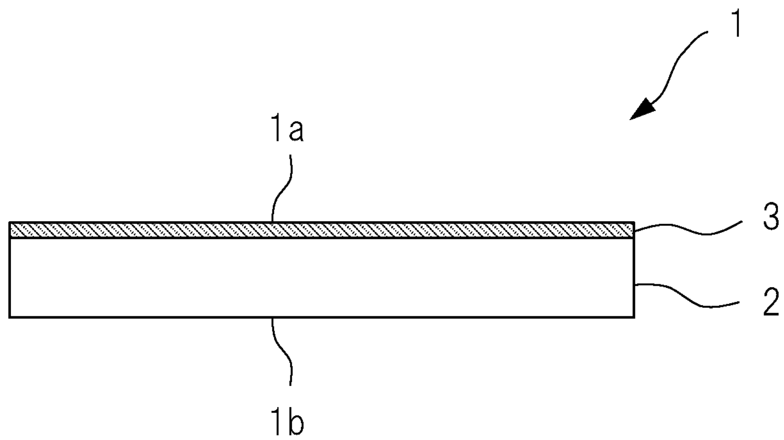
FIG. 1 is a side view of a SiC epitaxial substrate in an embodiment.

For example, a Sic epitaxial substrate 1 having an epitaxial film 3 formed on a front surface of a silicon carbide substrate 2 as illustrated in FIG. 1 is exemplified as the SiC epitaxial substrate of the present embodiment. The SiC epitaxial substrate 1 is a substrate having a flat plate shape, and has a main surface 1*a* (first main surface) made of the epitaxial film 3 and a main surface 1*b* (second main surface) opposite to the main surface 1*a*. In the present specification, the surface (main surface 1*a*) made of the epitaxial film 3 or the surface of the silicon carbide substrate 2 on which the epitaxial film 3 is formed may be referred to as “front surface” and the surface opposite to the front surface may be referred to as “back surface”.

The silicon carbide substrate 2 is a substrate made of single crystal silicon carbide (Sic). In the present embodiment, note that the flatness in the case of the Sic epitaxial substrate 1 is favorable to satisfy a predetermined range as described later.

The epitaxial film 3 is an epitaxial film obtained by epitaxially growing silicon carbide on the front surface of the silicon carbide substrate 2.

Although the size of the SiC epitaxial substrate 1 is not particularly limited, the diameter of the substrate is preferably 150 mm or more and more preferably 200 mm or more in consideration of 41 the manufacturing efficiency of the semiconductor chips.

As described above, the SiC epitaxial substrate 1 in which the epitaxial film 3 is formed on the front surface of the silicon carbide substrate 2 has a feature that is very excellent flatness of the substrate.

Regarding the flatness of the SiC epitaxial substrate 1, the inventors have specifically focused on Site Back Surface Referenced Ideal Ranges (SBIR), have found a new manufacturing method capable of making this property excellent, and could have obtained the SiC epitaxial substrate 1 having the very excellent flatness.

That is, in the SBIR of the SiC epitaxial substrate 1 in the present embodiment, a maximum value of the SBIR on the main surface 1*b* of the SiC epitaxial substrate 1 based on a 10 mm square site satisfies a condition of 0.1 μm or more and 1.5 μm or less.

Since the SBIR is within the predetermined range as described above, the SiC epitaxial substrate 1 of the present embodiment has excellent substrate flatness, and causes an excellent chip yield manufacturing in manufacturing semiconductor chips. More specifically, in a photolithography process, a mask pattern is formed on the epitaxial film 3 of the SiC epitaxial substrate 1, and the formed mask pattern can be a desired mask pattern since the flatness of the SiC epitaxial substrate 1 is excellent, and misalignment in the vertical direction relative to the main surface of the substrate can be suppressed. Thus, in manufacturing semiconductor chips using the SiC epitaxial substrate 1, the misalignment of the mask pattern can be made extremely small, and therefore, its manufacturing yield can be improved.

Further, the ratio of sites where the SBIR is 0.5 μm or less is preferably 65% or more. When such a site ratio condition is satisfied, the flatness of the SiC epitaxial substrate 1 is extremely excellent, and the semiconductor chip manufacturing yield can be further improved.

Figure 2:
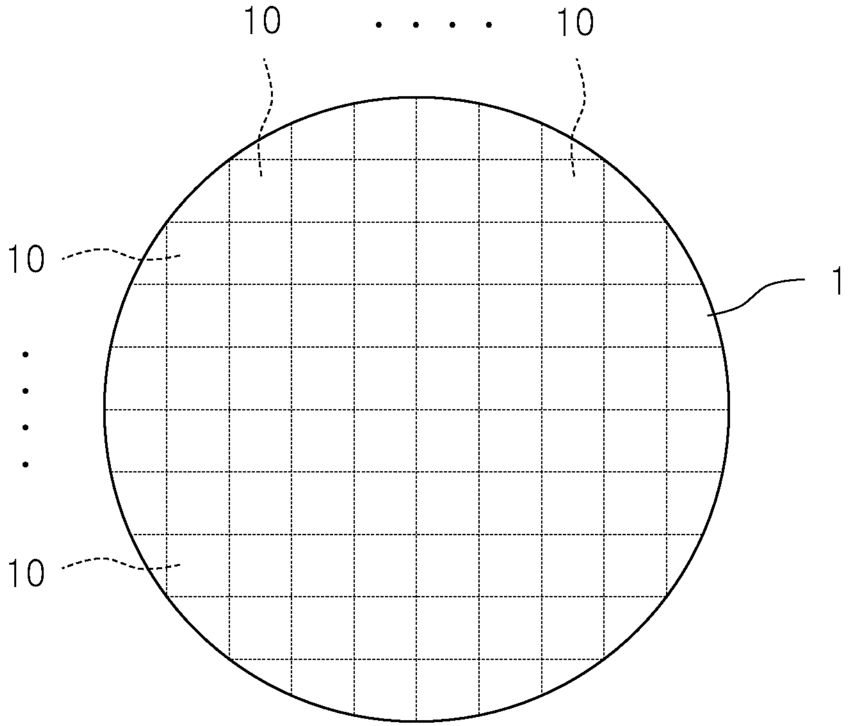
FIG. 2 is a diagram illustrating an example of sectioning of sites for evaluating flatness in the SiC epitaxial substrate of FIG. 1.

Note that the above-mentioned site ratio is calculated from, when the SiC epitaxial substrate 1 is divided into sites as illustrated in FIG. 2, a ratio of the number of sites where the SBIR is 0.5 μm or less to the total number of sites (“the number of sites where the SBIR is 0.5 μm or less”/“the total number of sites”).

In measurement of the SBIR, first, as illustrated in FIG. 2, a plurality of sites 10 each (evaluation domain) of which has, for example, a size of 10 mm square are sectioned and defined on the SiC epitaxial substrate 1. The SBIR can be obtained as described below, based on the 10 mm square site. In the present embodiment, note that the example in which the 10 mm square site is defined is exemplified, and the flatness is evaluated based on the site. However, the size of the site can be optionally changed.

Figure 3:
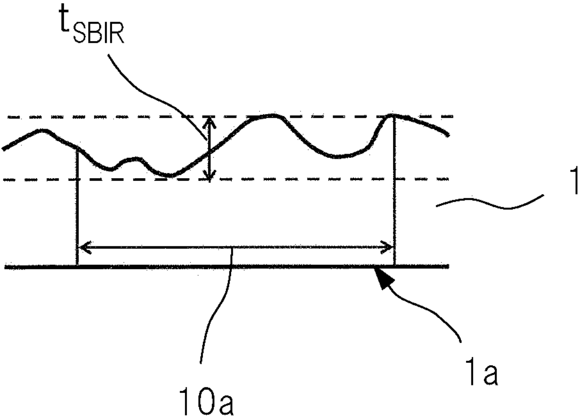
FIG. 3 is a diagram for explaining a method of measuring SBIR.

Next, as illustrated in FIG. 3, the main surface 1*a*, which is the surface opposite to the main surface 1*b* to be measured in the SiC epitaxial substrate 1, is suctioned and fixed to a flat surface to flatten the main surface 1*a*. An arrow 10*a* in FIG. 3 schematically shows a length of one side of the square site. The SBIR is the difference (height difference indicated by an arrow $t_{SBIR}$ in FIG. 3) between a height of the highest point and a height of the lowest point on the site surface based on the main surface 1bin the site of a predetermined range (e.g., a 10 mm square range).

In the present embodiment, a maximum value of the SBIR is preferably 1.5 μm or less, and a smaller maximum value is preferred since the focusing accuracy is more improved. According to the present embodiment, it is particularly preferred that, when the SiC epitaxial substrate 1 is divided into the plurality of sites in the unit of 10 mm square, the maximum value be within the above range (0.1 μm or more and 1.5 μm or less) while the ratio of sites where the SBIR is 0.5 μm or less be 65% or more. Satisfying such conditions makes it possible to accurately perform a photolithography process and improve the manufacturing yield of the resultant semiconductor chips. Further, it is more preferred that the site ratio be higher. This achieves a finer wiring pattern when the photolithography process is applied. Improving the flatness is more preferred because an exposure apparatus having a short exposure wavelength and a small depth of focus (DOF) range, that is, having a narrow depth of focus can be used to achieve a finer wiring pattern.

It has also been found that, for the flatness of the SiC epitaxial substrate 1, the characteristics of Site Front side least sQuares focal plane Range (SFOR) can be made excellent.

That is, a maximum value of the SFOR of the SiC epitaxial substrate 1 in the present embodiment based on the 10 mm square site satisfies a condition of 0.1 μm or more and 1.5 μm or less on the main surface 1*a* of the SiC epitaxial substrate 1.

Since the SFQR is set within the predetermined range as described above, the SiC epitaxial substrate 1 of the present embodiment has more excellent flatness as a substrate, and the excellent chip manufacturing yield in manufacturing the semiconductor chips can be achieved. More specifically, in the photolithography process, a mask pattern is formed on the epitaxial film 3 of the SiC epitaxial substrate 1, and the formed mask pattern can be a desired mask pattern since the flatness of the SiC epitaxial substrate 1 is excellent, and misalignment in the vertical direction relative to the main surface of the substrate can be suppressed. Thus, in manufacturing semiconductor chips using the SiC epitaxial substrate 1, the misalignment of the mask pattern can be made extremely small, and therefore, its manufacturing yield can be improved.

Further, the ratio of sites where the SFOR is 0.3 μm or less is preferably 85% or more. When such a site ratio condition is satisfied, the flatness of the SiC epitaxial substrate 1 is extremely excellent, and the semiconductor chip manufacturing yield can be further improved.

Note that the above-mentioned site ratio is calculated from, when the SiC epitaxial substrate 1 is divided into sites as illustrated in FIG. 2, a ratio of the number of sites where the SFOR is 0.3 μm or less to the total number of sites ("the number of sites where the SFOR is 0.3 μm or less"/"the total number of sites").

In measurement of the SFOR, first, as illustrated in FIG. 2, as similar to the measurement of the SBIR, a plurality of sites 10 each (evaluation domain) of which has, for example, a size of 10 mm square are sectioned and defined on the Sic epitaxial substrate 1. The SFOR can be obtained as described below, based on the 10 mm square site. In the present embodiment, note that the 10 mm square site is defined, and the flatness is evaluated based on the site. However, the size of the site can be optionally changed.

Figure 4:
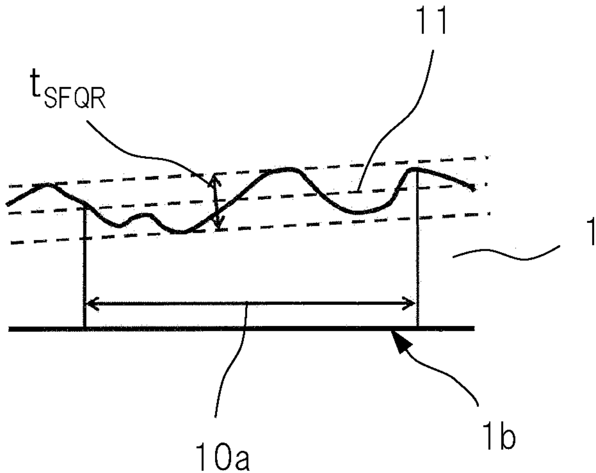
FIG. 4 is a diagram for explaining a method of measuring SFQR.

Next, as illustrated in FIG. 4, the main surface 1*b*, which is the surface opposite to the main surface 1*a* to be measured in the SiC epitaxial substrate 1, is suctioned and fixed to a flat surface to flatten the main surface 1*b*. An arrow 10*a* in FIG. 4 schematically shows a length of one side of the square site. The SFOR is a total (distance indicated by an arrow $t_{SFQR}$ in FIG. 4) of a distance from a reference surface 11 calculated by a least-squares method in this state based on a surface shape of the site of a predetermined range (e.g., a 10 mm square range) to the highest point on the site surface and a distance from it to the lowest point on the site surface.

In the present embodiment, a maximum value of the SFOR is preferably 1.5 μm or less, and a smaller maximum value is preferred since the focusing accuracy in exposure using a stepper (a reduced projection exposure apparatus) s more improved. According to the present embodiment, it is particularly preferred that, when the SiC epitaxial substrate 1 is divided into the plurality of sites in the unit of 10 mm square, the maximum value be within the above range (0.1 μm or more and 1.5 μm or less) while the ratio of sites where the SFOR is 0.3 μm or less be 85% or more. Satisfying such conditions makes it possible to accurately perform a photolithography process and improve the manufacturing yield of the resultant semiconductor chips. Further, it is more preferred that the site ratio be higher. This achieves a finer wiring pattern when the photolithography process is applied.

(Method of Manufacturing SiC Epitaxial Substrate)

Next, a method of manufacturing the SiC epitaxial substrate of the present embodiment will be described in detail while the SiC epitaxial substrate 1 described above is exemplified.

(a) Substrate Preparation Step

Figure 5:
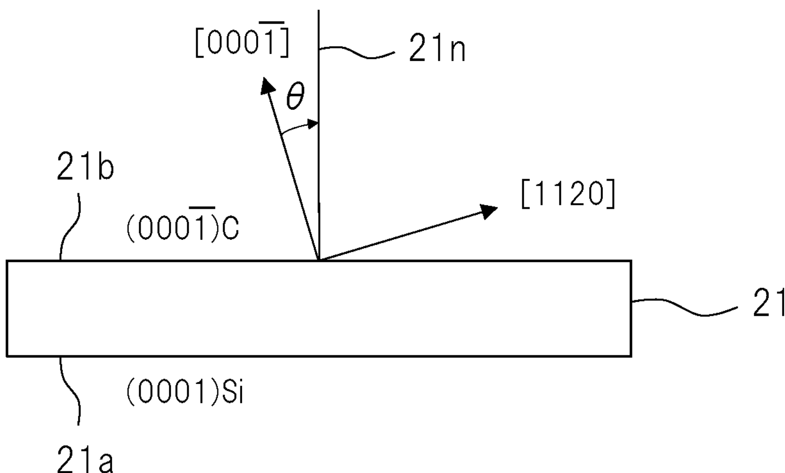
FIG. 5 is a diagram for explaining a method of manufacturing the SiC epitaxial substrate in the embodiment.

First, a plate-shaped silicon carbide substrate is prepared (step (a)). This step prepares a silicon carbide substrate 21 as illustrated in FIG. 5. FIG. 5 is a diagram schematically illustrating a side surface of the silicon carbide substrate 21. The silicon carbide substrate 21 is a material of the silicon carbide substrate 2 configuring the SiC epitaxial substrate 1, and is a flat-plate silicon carbide substrate.

The silicon carbide substrate 21 has a flat plate shape as described above, and has a main surface 21*a* and a main surface 21*b*. In this case, the main surface 21*a* is a surface where silicon carbide is epitaxially grown, and the main surface 21*b* is a surface opposite to the main surface 21*a* (the surface to be processed by polishing or grinding).

The silicon carbide substrate 21 prepared herein is preferably an off substrate having an off angle θ. Specifically, the main surface 21*b* or a normal line 21*n* to the main surface 21*b* is preferably inclined by the angle θ from a direction [000-1] to a direction [1120]. The off angle θ is preferably 0.5° or more and 8° or less, and more preferably 0.5° or more and 5° or less.

In the preparation of the silicon carbide substrate 21, first, a silicon carbide single crystal ingot is cut into a plate shape by a wire saw. Then, since a cutting surface of the wire saw has undulation or surface asperities, the surface roughness portion is selectively removed to flatten the surface by a diamond grinding wheel, diamond slurry or others.

The flattened main surface 21*a* of the silicon carbide substrate is preferably subjected to chemical mechanical polishing (CMP). Specifically, the main surface 21*a* is preferably polished by CMP until a surface roughness Ra of the first main surface is 1 nm or less. The surface roughness Ra of the main surface 21*a* is more preferably 0.2 nm or less.

The surface roughness Ra can be measured by, for example, a white light interference microscope. For example, the surface roughness Ra is a value obtained by measuring the main surface 21*a* at three positions with a 100 μm length and finding the average thereof. The surface roughness Ra could ideally be 0 nm, but the surface roughness Ra never practically becomes 0 nm. Thus, a lower limit value of a preferable range of the surface roughness Ra is larger than zero. Note that the surface roughness Ra in the present specification is the surface roughness Ra specified in JIS B 0601-2001.

Note that the surface roughness Ra of the main surface 21*a* of the silicon carbide substrate 21 prepared at this time is preferably 0.2 nm or less for epitaxial growth. Such a smooth surface enables an epitaxial film formed through the epitaxial growth described later to have a preferable surface that takes over the smoothness.

On the other hand, in the step of forming the epitaxial film described later, a deposit adheres to the main surface 21*b* or the main surface 21*b* is roughened. Also, thereafter, in the step of polishing or grinding described later, the main surface 21*b* is a surface, a surface layer of which is removed, and a new smooth surface is formed thereon. Thus, in the silicon carbide substrate 21 prepared in the step (a) described above, the main surface 21*b* does not previously need to be subjected to processing for improving the smoothness. That is, the main surface 21*b* can be a rough surface having a surface roughness Ra of, for example, 200 nm or more.

In this manner, the silicon carbide substrate 21 may be prepared so as to have one side surface that is smooth and the other side surface that is not smooth but rough, and does not need to have both side surfaces that are smooth. Thus, in this point, the manufacturing cost can be reduced.

(b) Epitaxial Film Growth Step

Next, silicon carbide is epitaxially grown on the front surface of the silicon carbide substrate prepared in the step (a) to form the first main surface on which an epitaxial film is formed (step (b)). This step is the step of forming the epitaxial film 3 on the main surface 21*a* of the prepared silicon carbide substrate 21.

For the formation of the epitaxial film 3, the following method can be exemplified. For example, the silicon carbide substrate 21 is placed on a plate coated with SiC, and is placed inside a susceptor coated with SiC. The plate and the susceptor are heated by induction heating or other methods to raise the temperature of the silicon carbide substrate 21 to a temperature such as 1500° C. or more and 1700° C. or less at which silicon carbide can be epitaxially grown.

While maintaining this heating state, the silicon carbide can be epitaxially grown on the front surface of the silicon carbide substrate 21 under a reduced pressure and flow of mixed gas of hydrogen serving as carrier gas, monosilane, propane, or the like serving as source gas, and nitrogen or the like serving as dopant gas.

Figure 6:
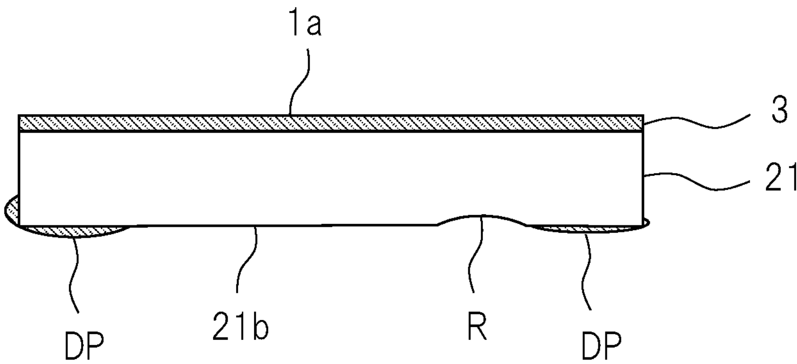
FIG. 6 is a diagram for explaining the method of manufacturing the SiC epitaxial substrate in the embodiment.

Accordingly, the epitaxial film 3 can be formed on the main surface 21*a* of the silicon carbide substrate 21, and a substrate in which the epitaxial film 3 is deposited on the entire main surface 21*a* of the silicon carbide substrate 21 can be obtained as illustrated in FIG. 6. The surface of the epitaxial film 3 formed as described above becomes the main surface 1*a* of the final resultant SiC epitaxial substrate 1.

The thickness of the epitaxial film 3 obtained at this time can be optionally set in accordance with a performance required for the semiconductor device. The thickness of the epitaxial film 3 can be set to, for example, 1 μm or more and 100 μm or less.

Note that, at this time, a deposit DP may adhere to a surface other than the main surface 21*a* of the silicon carbide substrate 21 due to the epitaxial growth of SiC. Also, roughness R may be formed on the silicon carbide substrate 21. In the present embodiment, even such formations of the deposit DP and the roughness R do not affect the final resultant SiC epitaxial substrate. A reason for this will be explained in (d) Grinding or Polishing Step.

(c) Protective Film Forming Step

Figure 7:
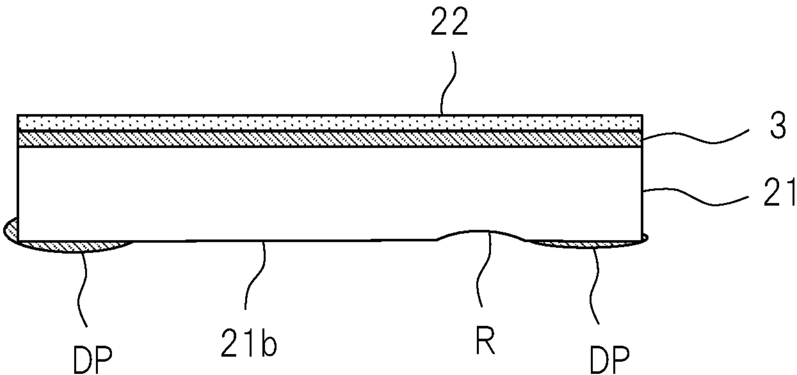
FIG. 7 is a diagram for explaining the method of manufacturing the SiC epitaxial substrate in the embodiment.

Next, a protective film is formed on the surface of the epitaxial film formed in the step (b) (step (c)). In this step, the protective film is formed on the surface of the epitaxial film 3, which is formed on the main surface 21*a* of the silicon carbide substrate 21 in the step (b). By the step (c), a protective film 22 is formed on the epitaxial film 3 as illustrated in FIG. 7.

In the present embodiment, the protective film 22 is formed after the epitaxial film 3 is formed. The protective film is not exposed to a high temperature condition as described in the Patent Document 1, and does not require high temperature resistance. Thus, a publicly-known protective film can be used without any particular limitation, and a wide variety of protective films can be used.

The protective film 22 formed at this time may be formed as a protective film having a certain film thickness formed by applying a liquid material onto the epitaxial film 3 and drying it, or may be formed by previously forming a protective film having a certain film thickness and pasting it onto the epitaxial film 3.

When the liquid material is used, a publicly-known thin film forming technique can be applied, and methods such as spin coating, dip coating, and spray coating can be exemplified. Among these methods, the spin coating is preferred because a protective film having a uniform thickness can be easily formed. The viscosity of the liquid material used at this time is preferably 100 mPa·s or less and more preferably 50 mPa·s or less.

In the present embodiment, note that it is particularly preferable to use a material that can reduce the load on the substrate and maintain excellent flatness. As such a material of the protective film 22, a resist, liquid wax or others is exemplified. These materials are preferred because of easily forming the protective film 22 and also easily being removed by a simple operation.

A usable resist is not limited to any particular resist as long as it can protect the epitaxial film 3, a publicly-known resist can be used, and positive-tone resists such as OFPR-800, OFPR-500, OFPR-8600, OFPR-8600 LB, TSMR-8900, and TSMR-V90 (product names, all manufactured by TOKYO OHKA KOGYO CO., LTD.) can be exemplified. The positive-tone resist contains components such as ethyl lactate or butyl acetate.

Usable liquid wax is not limited to any particular liquid wax as long as it can protect the epitaxial film 3, publicly-known liquid wax can be used, and SKYLIQUID LA-3011H, LA-4011H, LA-5011H, and LA-5511H (product names, all manufactured by NIKKA SEIKO CO., LTD.) can be exemplified. The liquid wax contains components such as rosin or isopropyl alcohol (IPA).

When the resist or the liquid wax as described above is used, the protective film can be removed by a simple operation without performing anisotropic etching or wet etching as described in the Patent Document 1, and the residues of the protective film can be suppressed.

In the present embodiment, the liquid material is used to obtain the flatness. The case of the formation of the protective film by the film paste causes a risk of variation of the flatness because the film is thick. The desired flatness can be obtained when the protective film is formed from the liquid material, for example, by spin coating to suppress an in-plane film thickness distribution to, for example, 20% or less.

(d) Grinding or Polishing Step

Further, after the protective film is formed, the main surface 21*b* of the silicon carbide substrate 21 opposite to the main surface 21*a* is ground or polished based on the shape of the surface (main surface 1*a*) of the epitaxial film 3 to form the main surface 1*b* (step (d)).

Figure 8:
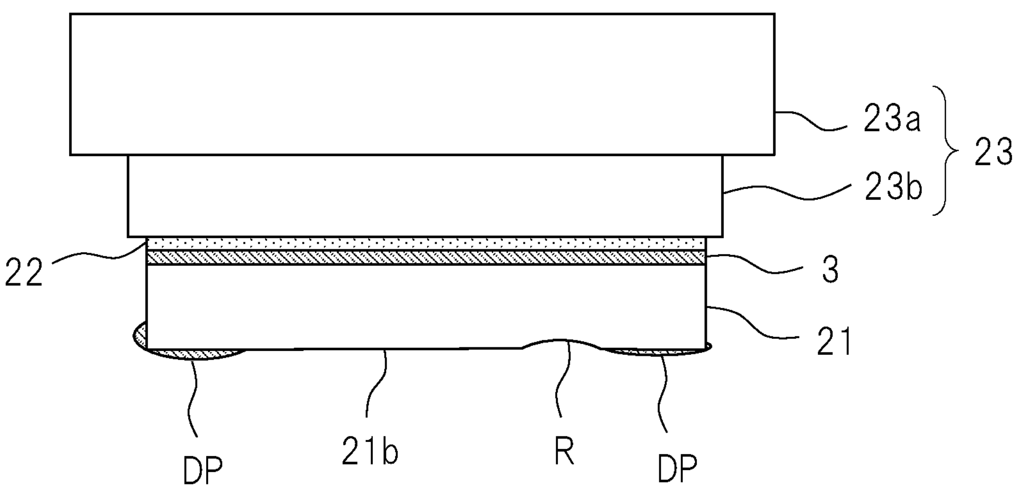
FIG. 8 is a diagram for explaining the method of manufacturing the SiC epitaxial substrate in the embodiment.

This processing step will be explained in the polishing example. At polishing, first, a surface of the substrate having the silicon carbide substrate 21, the epitaxial film 3, and the protective film 22, the surface close to the protective film 22, is fixed by suction, adhesion, or the like. As illustrated in FIG. 8, for example, a vacuum chuck 23 used for the fixing is made of a base plate 23*a* and a suction plate 23*b*, and is connected to a vacuum device not illustrated. By suction action of the vacuum device, the substrate can be fixed onto the surface of the suction plate 23*b*.

Figure 9:
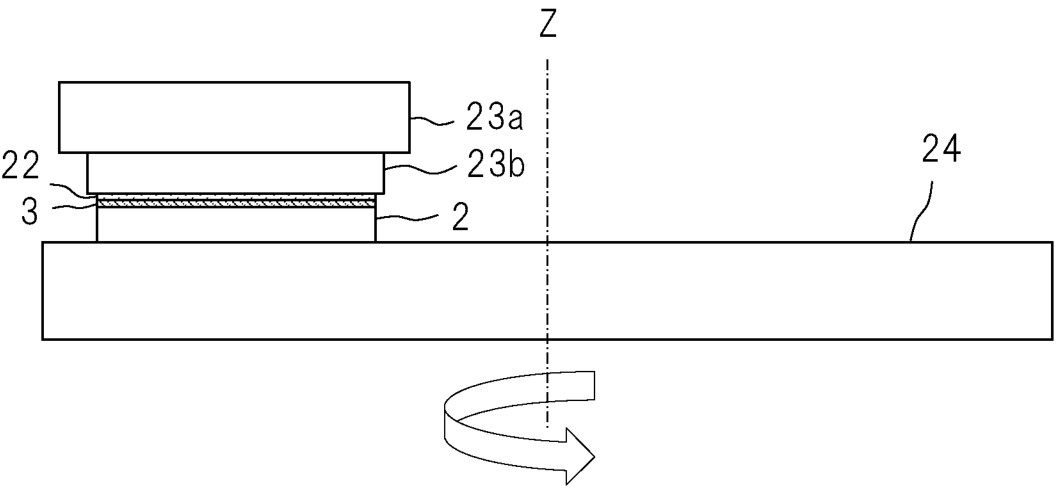
FIG. 9 is a diagram for explaining the method of manufacturing the SiC epitaxial substrate in the embodiment.

As illustrated in FIG. 9, in the vacuum chuck 23 that fixes the silicon carbide substrate 21 that is the polishing target as described above, the target can be polished into a desired shape when its polishing surface faces a polishing surface plate 24 of a single side polisher and is in contact with the polishing surface plate 24. Here, the polishing surface plate 24 rotates about, for example, a Z axis extending in the vertical direction.

The polishing in this step can be performed by a publicly-known method if the method can polish the silicon carbide substrate 21, and is not limited to any particular method. Also, the single side polisher is preferred because the pressing force can be adjusted.

In this polishing, diamond slurry may be dropped onto the polishing surface plate 24, and the main surface 1*b* may be pressed against the polishing surface plate 24 with the main surface 1*a* held. A metal surface plate, a urethane-based pad, a nonwoven fabric pad, or the like is used as the polishing surface plate 24.

At this time, the rotation speed of the polishing surface plate 24 is preferably 10 rpm or more and 30 rpm or less, and the pressing force is preferably 5 kPa or more and 20 kPa or less. The diamond grain size of the diamond slurry used is 0.5 μm or more and 5 μm or less. The polishing amount is preferably 1 μm or more and 10 μm or less, and the surface roughness Ra of the polishing surface is preferably 0.3 nm or more and 1 nm or less.

Note that processing using loose abrasive grains (lapping), processing using fixed abrasive grains (grinding), processing using a diamond wheel, or the like can be used to polish a substrate made of a high hardness material such as silicon carbide.

The polishing example has been explained above. However, a grinder may be used to perform processing. Even in the case of the usage of the grinder, similarly, the main surface 1*b* may be ground while the main surface 1*a* having the protective film 22 formed thereon is held. A method of the holding is the same as the above, and grinding can be performed by holding the main surface 1*a* and giving a certain amount of cut while keeping the main surface 1*b* in contact with a grinding wheel.

The grinding wheel contains diamond abrasive grains, and the grain size thereof is preferably #2000 or more and #8000 or less. For example, a vitrified bond grinding wheel or a resin bond grinding wheel is used as the grinding wheel.

The rotation speed of the grinding wheel is preferably 2000 rpm or more and 5000 rpm or less, and the cutting amount is preferably 0.2 μm/min or more and 2 μm/min or less. Pure water or water containing additives may be used to cool the grinding wheel, the grinding amount may be 1 μm or more and 10 μm or less, and the surface roughness Ra of the polishing surface may be 0.3 nm or more and 1 nm or less.

Also, after such grinding or polishing, CMP (polishing) can also be performed as necessary to remove polishing damage. Also, when a smoother surface is required, CMP (polishing) may be performed.

The polishing is performed based on the shape of the main surface 1*a*. At this time, the polishing surface is preferably processed as a surface corresponding to the shape of the main surface 1*a* to obtain the main surface 1*b*. In such a corresponding surface, the thickness of the SiC epitaxial substrate 1 is a substantially uniform thickness, and its shapes at the corresponding positions on the front and back surfaces have the same inclination. Thus, the substrate having extremely excellent flatness can be obtained.

In the present embodiment, the SiC epitaxial substrate is subjected not to double-sided processing, but to single-sided processing. The double-sided processing is difficult to control the film thickness of the epitaxial film because of also polishing the film surface of the epitaxial film. However, the single-sided processing is excellent in that the film thickness of the epitaxial film can be controlled.

The resultant SiC epitaxial substrate 1 as described above can satisfy the characteristics of the SiC epitaxial substrate such as the SBIR and the SFOR described in the present embodiment.

Also, in the SiC epitaxial substrate of the present invention, the basal plane dislocation density (BPD density) of the epitaxial film is preferably 0.01 cm-2 or less, more preferably 0.001 cm-2 or less, and particularly preferably zero. The high site ratios satisfying the SBIR and the SFOR described above prevent an element formed on the epitaxial film from becoming defective, and therefore, prevent the man-hours for the element required to manufacture the SiC epitaxial substrate having the epitaxial film having a low basal plane dislocation density from being wasted. Also, the epitaxial film may include a buffer layer and a drift layer. The buffer layer may be made of two or more layers (e.g., a low-concentration layer and a hole barrier layer), and the epitaxial film may include a layer having an impurity concentration of, for example, $5\times10^{18}$ $cm^{-3}$ or more and $1\times10^{19}$ $cm^{-3}$ or less and a basal plane dislocation density of, for example, 0 $cm^{-2}$ or more and 0.01 $cm^{-2}$ or less as the hole barrier layer.

Figure 10:
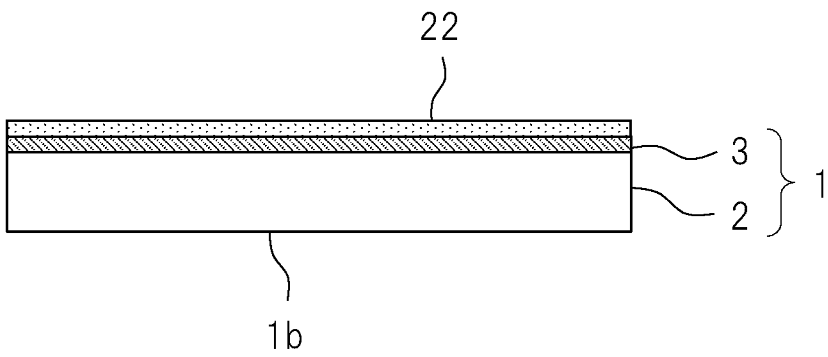
FIG. 10 is a diagram for explaining the method of manufacturing the SiC epitaxial substrate in the embodiment.

When the polishing is finished, the substrate is removed from the vacuum chuck 23 to obtain the SiC epitaxial substrate 1 having the main surface 1*b* formed thereon and having the protective film 22 as illustrated in FIG. 10.

(e) Protective Film Removing Step

Then, after the step (d), the protective film 22 is removed from the SiC epitaxial substrate 1 with the protective film 22 illustrated in FIG. 10 (step (e)). The SiC epitaxial substrate 1 can be obtained by the step (e). The protective film can be removed by a method suitable for the removal depending on the used material of the protective film.

When the resist is used as the protective film, a solvent or a stripper that can strip the used resist off may be used, and organic solvents such as acetone and N-methyl-2-pyrrolidone (NMP), and Stripper-104, Stripper-105, Stripper-106, Stripper-502A, SST-A47, Clean Strip HP, and Clean Strip HP-2 (product names, all manufactured by TOKYO OHKA KOGYO CO., LTD.) and others can be exemplified.

In the case of the usage of the liquid wax as the protective film, removal by a scraper, removal by alkaline cleaning and others can be exemplified. As a cleaning agent, DEVEL and KILALACLEAN (product names, all manufactured by NIKKA SEIKO CO., LTD.) and others can be exemplified.

The cleaning agent or the stripper as descried above is stored in a protective film removal tank, and the silicon carbide substrate that has undergone the step (d) is placed inside the protective film removal tank. The temperature of the cleaning agent or the stripper is not limited to any particular temperature, and is preferably used in a range of room temperature (around 20° C.) or more and 60° C. or less.

The stripping time is set to 2 minutes or more and 10 minutes or less, and the substrate after the stripping is rinsed so that no stripper residue remains. The rinsed substrate is dried using a spin dryer or the like. In this manner, the intended SiC epitaxial substrate 1 is obtained.

In the protective film removing step, in order to efficiently remove the protective film 22, ultrasonic vibration (e.g., 45 kHz-600 W) may be applied to the protective film removal tank, or the silicon carbide substrate placed inside the protective film removal tank may be shaken up and down inside the removal tank.

The SiC epitaxial substrate 1 from which the protective film has been removed is tested for required inspection items. Thereafter, the substrate that satisfies predetermined characteristics is used in a semiconductor chip manufacturing process. Particularly, among the above materials, the resist or the liquid wax if used as the protective film can be extremely well removed, and the number of residues on the substrate surface of the resultant SiC epitaxial substrate 1 is less than 0.1 pieces/cm$^2$, which is extremely excellent.

Such a resultant SiC epitaxial substrate 1 is the substrate having the excellent flatness described above, and can significantly improve the semiconductor chip manufacturing yield thereafter.

EXAMPLES

A single crystal manufacturing apparatus and a single crystal manufacturing method of the present embodiment will be described below in detail with reference to examples. It is needless to say that the present invention is not interpreted to be limited to the description of the examples.

Example 1

A silicon carbide substrate 21 that has a (0001) Si surface as the main surface 21*a* and has the off angle θ of 4° and the diameter of 150 mm was prepared. The CMP was performed on the main surface 21*a* until the surface roughness Ra reached 0.5 nm or less (the surface roughness Ra of the main surface 1*b* was approximately 2 nm).

Then, an epitaxial film 3 having a thickness of 10 μm was formed by epitaxially growing silicon carbide on the main surface 21*a* of the silicon carbide substrate. The growth temperature was set to 1600° C., and the pressure inside a growth chamber during the growth was set to 30 kPa. The C/Si in source gas was set to 1.25 or 1.4. Hydrogen was used as the carrier gas, and propane and silane were used as the source gas. Nitrogen was used as the dopant source.

Next, a protective film 22 was formed on the surface (main surface 1*a*) of the epitaxial film 3 formed on the front surface of the silicon carbide substrate 21. A spin coater (product name: CLEAN TRACK Mark, manufactured by Tokyo Electron Limited.) was used to form the protective film, and a positive-tone resist (product name: OFPR-8600 LB, manufactured by TOKYO OHKA KOGYO CO., LTD.) was used as the protective film. The resist contains ethyl lactate, butyl acetate, or the like as a component.

The protective film forming conditions are set as a substrate rotation speed: 1500 rpm, rotation time: 30 sec, application amount: 3.6 mL, bake temperature: 140° C., bake time: 120 sec., and cooling time: 60 sec., and the film having a uniform thickness of approximately 1 μm was formed.

Next, the main surface 21*b* was polished while the main surface 1*a* with the protective film 22 formed thereon was held. As the holding method, the silicon carbide substrate 21 was fixed by vacuum suction to prevent change in its posture during the polishing. The main surface 1*b* was formed by polishing the main surface 21*b* using a single side polisher (product name: SLM-35, manufactured by Fujikoshi Machinery Corp.) until the surface roughness Ra reached 0.5 nm based on the main surface 1*a*.

After completion of the polishing of the main surface 21*b*, the protective film 22 was stripped off. The stripper NMP for the protective film was stored in the protective film removal tank, and the silicon carbide substrate that has undergone the back surface polishing was soaked and placed inside the protective film removal tank.

The silicon carbide substrate was soaked for 5 minutes in the stripper having a temperature of 60° C. to strip the protective film off. The stripped-off substrate was rinsed with a rinse solution to remove the stripper residues, and then, the substrate was dried using a spin dryer to obtain a SiC epitaxial substrate 1.

Comparative Example 1

A SiC epitaxial substrate was manufactured by the same operation as that in Example 1 except that the polishing (back surface polishing) of the main surface 21*b* was not performed.

[Evaluation of Flatness]

One hundred SiC epitaxial substrates obtained in each of Example 1 and Comparative Example 1 were prepared, and the SBIR and the SFOR were measured for evaluation of the flatness of each of the substrates. For each measurement on the one hundred substrates, a maximum value, an average value, the ratio of sites where the SBIR is 0.5 μm or less, the ratio of sites where the SBIR is 0.8 μm or less, the ratio of sites where the SFOR is 0.3 μm or less, and the ratio of sites where the SFOR is 0.5 μm or less were evaluated. The results are collectively shown in Table 1.

TABLE 1

| | | Example 1 | Comparative example 1 |
|---|---|---|---|
| SBIR | Average value | 0.15 μm | 0.48 μm |
| | Maximum value | 0.93 μm | 1.80 μm |
| | Ratio of sites with | 99% | 62% |

TABLE 1-continued

| | | Example 1 | Comparative example 1 |
|---|---|---|---|
| | 0.5 μm or less | | |
| | Ratio of sites with 0.8 μm or less | 100% | 91% |
| SFQR | Average value | 0.09 μm | 0.23 μm |
| | Maximum value | 0.76 μm | 1.32 μm |
| | Ratio of sites with 0.5 μm or less | 98% | 80% |
| | Ratio of sites with 0.8 μm or less | 99.7% | 98% |

Example 2

A SiC epitaxial substrate was manufactured by the same operation as that in Example 1 except that liquid wax was used as the protective film.

As the liquid wax used herein, liquid wax containing rosin and isopropyl alcohol (IPA) (product name: SKYLIQUID LA-3011H, manufactured by NIKKA SEIKO CO., LTD.) was used, and a coater (product name: SCMM-7, manufactured by Fujikoshi Machinery Corp.) was used.

The protective film forming conditions are set as a substrate rotation speed: 2500 rpm, rotation time: 10 sec, application amount: 2 mL, bake temperature: 95° C., bake time: 20 sec., and cooling time: 60 sec., and the film having a uniform thickness of approximately 2 μm was formed.

It was confirmed that the resultant SiC epitaxial substrate in Example 2 also has the same flatness level as that in Example 1.

The above results show that, according to the SiC epitaxial substrate and the method of manufacturing the SiC epitaxial substrate in the present embodiment, it has been found that the SiC epitaxial substrate having extremely excellent flatness can be reliably obtained by a simple operation.

In the foregoing, the invention made by the inventors of the present application has been concretely described on the basis of the embodiments. However, it is needless to say that the present invention is not limited to the foregoing embodiments, and various modifications and alterations can be made within the scope of the present invention.

What is claimed is:

1. A SiC epitaxial substrate having an epitaxial film obtained by epitaxially growing silicon carbide on a front surface of a silicon carbide substrate, wherein the SiC epitaxial substrate has a first main surface made of the epitaxial film and a second main surface opposite to the first main surface, and has a diameter of 150 mm or more, and a maximum value of SBIR on the second main surface based on a 10 mm square site is 0.1 μm or more and 1.5 μm or less, and a maximum value of SFQR on the first main surface based on the 10 mm square site is 0.1 μm or more and 1.5 μm or less;

wherein, the epitaxial film includes a buffer layer and a drift layer, the buffer layer being made of two or more layers comprising a low-concentration layer and a hole barrier layer, and the epitaxial film includes a layer having an impurity concentration of $5\times10^{18}$ $cm^{-3}$ or more and $1\times10^{19}$ $cm^{-3}$ or less, wherein the basal plane dislocation density of the surface of the epitaxial film is 0.01 $cm^{-2}$ or less.

2. The SiC epitaxial substrate according to claim 1, wherein a ratio of sites where the SBIR is 0.5 μm or less is 65% or more.

3. The SiC epitaxial substrate according to claim 1, wherein a ratio of sites where the SFQR is 0.3 μm or less is 85% or more.

4. The SiC epitaxial substrate according to claim 1, wherein the SiC epitaxial substrate has a diameter of 200 mm or more.

5. A method of manufacturing a SiC epitaxial substrate comprising steps of:

(a) preparing a plate-shaped silicon carbide substrate;

(b) forming a first main surface made of an epitaxial film by epitaxially growing silicon carbide on a front surface of the silicon carbide substrate;

(c) forming a protective film on a surface of the epitaxial film;

(d) forming a second main surface by grinding or polishing a surface of the silicon carbide substrate, the surface being opposite to the first main surface, based on a shape of the first main surface; and (e) removing the protective film;

wherein, the protective film is made of a resist, wherein the resist is a positive-tone resist containing at least one type material selected from ethyl lactate and butyl acetate.

6. The method of manufacturing the SiC epitaxial substrate according to claim 5, wherein the liquid wax is liquid wax containing at least one type material selected from rosin and isopropyl alcohol.

7. The method of manufacturing the SiC epitaxial substrate according to claim 5, wherein, in the step (e), ultrasonic vibration is applied or the silicon carbide substrate is shaken up and down.

8. The method of manufacturing the SiC epitaxial substrate according to claim 5, wherein the number of residues on a substrate surface of the SiC epitaxial substrate is less than 0.1 pieces/$cm^2$.

* * * * *